Nov. 21, 1961 W. S. ALBERT 3,010,057

SEMICONDUCTOR DEVICE

Filed Sept. 6, 1960

WITNESSES

John E. Healy, Jr.

James F. Young

INVENTOR

Willard S. Albert

BY

F. E. Browder

ATTORNEY

United States Patent Office 3,010,057 Patented Nov. 21, 1961

3,010,057

SEMICONDUCTOR DEVICE

Williard S. Albert, Penn Township, Westmoreland County, Pa., assignor to Westinghouse Electric Corporation, East Pittsburgh, Pa., a corporation of Pennsylvania Filed Sept. 6, 1960, Ser. No. 54,140
6 Claims. (Cl. 317—234)

The present invention relates to semiconductor devices, such as semiconductor diodes, controlled rectifiers, and transistors, and has particular reference to improved devices capable of withstanding repeated thermal cycling, and processes for making the same.

It is well known that semiconductor materials selected from the group comprising silicon and germanium are very useful for making diodes, controlled rectifiers, transistors, and other electrical devices.

It is an object of this invention to provide a semiconductor device in which the semiconductor material is supported in such a manner that it is not subjected to appreciable mechanical stresses and so that heat generated in the semiconductor can be readily conducted away.

It is another object of the present invention to provide a semiconductor device capable of withstanding indefinitely service conditions such as alternate temperature changes as the device is subjected to successive application and interruption of flow of electrical current.

It is still another object of this invention to provide a semiconductor device wherein the current conducting leads may be attached to the semiconductor device without setting up additional lock-in stresses in the semiconductor device which might tend to destroy the semiconductor device.

It is still another object of the present invention to provide a semiconductor device capable of withstanding indefinitely cyclic temperature changes in service, by joining elements having unlike coefficients of thermal expansion by brazing or hard soldering and joining elements having like coefficients of thermal expansion with soft solder.

Figure 1:
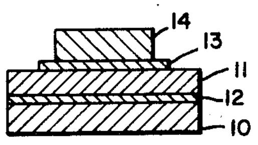
FIGURE 1 is a sectional view of a semiconductor device which may utilize this invention, specifically a semiconductor diode having a p-n junction therein.

The p-n junction diode of FIG. 1 is constructed in accordance with the teachings of the John L. Boyer and August P. Colaiaco Patent 2,933,662. The semiconductor material in this diode may be selected from the group containing silicon or germanium.

In constructing the diode of FIG. 1 a support plate 10 of the proper size is prepared from one of the metals selected from the group of metals containing molybdenum, tungsten, or tantalum or any of the base alloys thereof. If the diode is to be made from germanium material, a thin fragile germanium wafer 11 of the proper size is prepared. A layer of pure tin solder 12 is placed on the support plate 10 and the germanium wafer 11 is placed on top of the layer of solder 12, an indium wafer 13 is then placed on top of the germanium wafer 11 and a second support plate 14 of the proper size is then placed on top of the indium layer 13. The support plate 14 is also made of one of the metals selected from the group containing molybdenum, tungsten or tantalum or any of the base alloys thereof. The assembly comprising the first support plate 10, the layer of tin solder 12, the germanium wafer 11, the layer of indium 13 and the second support plate 14 is then placed in a suitable furnace and heated to a temperature high enough to melt the tin solder and the indium and cause the indium to fuse with the germanium 11 and form a p-n rectifying junction therein. The temperature to which the assembly must be heated to cause the indium 13 to fuse with the germanium 11 and form a p-n rectifying junction is approximately 615° C. The minimum solidus for germanium-tin is approximately 232° C. The minimum solidus for germanium-indium is approximately 156° C.

If the diode of FIG. 1 is constructed using silicon for the semiconductor material again a support plate 10 selected from the group comprising molybdenum, tungsten, tantalum or any of the base alloys thereof of the proper size is prepared. A layer of aluminum 12 is provided on the first support plate 10, a wafer of "P" type conductivity silicon 11 of the proper size is prepared and placed on the layer of aluminum 12, a "N" conductivity type alloy such as gold-antimony wafer 13 is placed on the silicon wafer 11 and a second support plate of the proper size is prepared from a metal selected from the group containing molybdenum, tungsten or tantalum and placed on the aluminum wafer 13. This assembly is then placed in a furnace and heated to a temperature high enough to melt the aluminum and the "N" conductivity type alloy wafer and cause the "N" conductivity type alloy to fuse with the silicon wafer and form a p-n rectifying junction in the silicon wafer. The temperature to which the assembly must be heated to cause the aluminum 13 to fuse with the silicon wafer 11 to provide an ohmic contact is approximately 895° C. The minimum solidus for aluminum-silicon is approximately 577° C. The minimum solidus for gold antimony-silicon is approximately 383° C.

Although I have specified indium and gold-antimony as doping materials in the two examples discussed above it is understood that any satisfactory doping material may be used without effecting the scope of this invention. Also, it is understood that both "N" type and "P" type conductivity silicon may be used with their associated doping materials without effecting the socpe of this invention.

In building high power semiconductor devices, especially rectifier diodes using germanium and silicon, the semiconductor wafer becomes fairly large, commonly one inch in diameter. The semiconductor material is usually prepared in the form of a very thin wafer and it is very brittle and will fracture if subjected to shocks or stresses. Both of these materials, germanium and silicon, have a maximum operating temperature. Therefore it is very important that the semiconductor material be adequately cooled. In the present invention, as in the invention described in the Boyer and Colaiaco Patent 2,933,662, the semiconductor element is protected and cooled by the support plates 10 and 14. In providing support plates for the semiconductor material, a material must be used which has a coefficient of expansion close to that of silicon and germanium. The support plate must also have good electrical and thermal conductivity. The thermal conductivity is especially important since in power rectifiers the losses result in the generation of a relatively large amount of heat in the small volume of semiconductor material and this heat must be rapidly conducted away in order to keep the temperature of the semiconductor material within the permissible limits. For satisfactory rectifier operation, the supporting plate which is joined to the semiconductor material therefore must have good thermal conductivity in order to conduct away the heat generated by the relatively high currents to be carried without overheating the rectifier.

It has been found from much experimentation that metals selected from the group containing molybdenum, tungsten and tantalum have the necessary thermal conductivity, electrical resistivity and thermal coefficient of expansion to provide excellent support plates and cooling means for germanium and silicon semiconductor devices and provide excellent means for conducting heat away from the germanium and silicon elements. The reason that these metals provide excellent support plates and cooling means for germanium and silicon semiconductor elements may be readily seen by reference to the table set forth below.

*Table*

| Material | Melting point ° C. | Thermal conductivity $\frac{cal. \times cm.}{cm.^2 \times sec. \times ° C.}$ | Electrical resistivity 20° C. $\frac{micro\ ohm's \times cm.^2}{cm.}$ | Linear coefficient of expansion $° C^{-1} \times 10^{-6}$ |
|---|---|---|---|---|
| Molybdenum | 2,620 | .346 | 5.7 | 5.1(20–100)° C.<br>5.4(20–200)° C. |
| Tungsten | 3,380 | .394 | 5.5 | 4.5(20–100)° C. |
| Tantalum | 2,977 | .13 | 13.5 | 6.5(20–100)° C.<br>6.52(20–200)° C. |
| Copper | 1,083 | .94 | 1.67 | 17(20–100)° C.<br>17.2(20–200)° C. |
| Germanium | 958 | .13 | (1) | 5.5(20–100)° C.<br>6(20–200)° C. |
| Silicon | 1,415±10 | .2 | (1) | 4.2(20–100)° C. |

[1] Semiconductor.

From an examination of the above table it is seen that molybdenum and tungsten have a better thermal conductivity than either germanium or silicon and tantalum has thermal conductivity nearly as good as germanium or silicon, which means that heat will be taken away from the germanium and silicon devices very effectively by support plates made of molybdenum, tungsten and tantalum. It is also seen from the above table that molybdenum, tungsten and tantalum have very good electrical conductivity which means that current passing through the rectifier will not generate appreciable heat in the molybdenum, tungsten or tantalum support plates. It is also seen from the above table that molybdenum, tungsten and tantalum have linear coefficients of expansion very close to that of germanium and silicon throughout the temperature ranges to which the semiconductor device will be heated in manufacture and use, which means that the support plates will not cause any appreciable stresses to be set up in the semiconductor element during the operation of the rectifier.

The diode of FIG. 1 and the method of making the diode is essentially that disclosed in the Boyer and Colaiaco Patent 2,933,662. Many efficient and commercially acceptable rectifier diodes have been made according to the teachings of the Boyer and Colaiaco Patent 2,933,662. However, as the semiconductor devices become larger in power ratings it becomes more difficult to attach current conducting leads to the devices.

Figure 2:
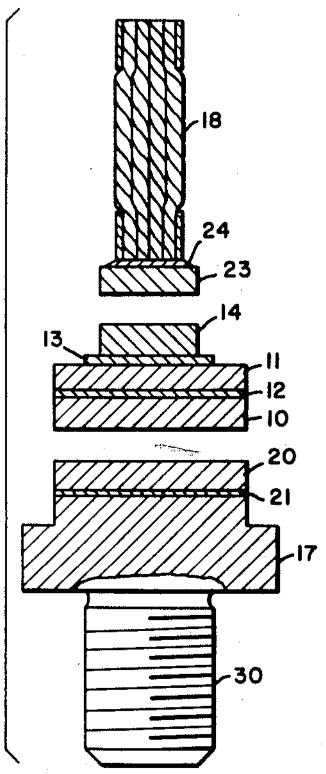
FIG. 2 is an exploded sectional view showing the diode of FIG. 1 and the current conducting electrodes which are to be attached to each side of the diode to provide for connecting the diode in an electrical circuit.
Figure 3:
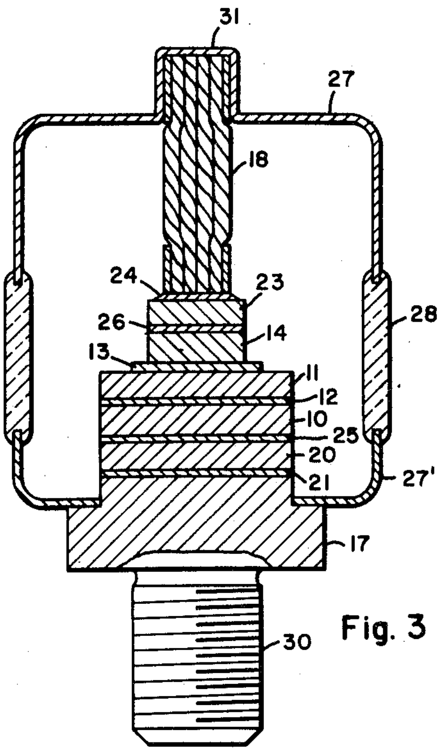
FIG. 3 is a sectional view of a completed p-n junction diode showing the diode of FIG. 1 with the current collecting electrodes attached thereto and with the diode enclosed in a hermetically sealed casing.

The current conducting leads are indicated by the reference character 17 and 18 in FIGS. 2 and 3. With a rectifier diode having a voltage rating of 1000 peak inverse volts and a current rating of 200 amperes average current, these leads 17 and 18 become rather large. In one device having these ratings the lead 17 is a copper stud approximately 1¾ inches in diameter and the lead 18 is a braided copper conductor approximately ¾ inch in diameter. In the prior art in order to attach the leads 17 and 18 to the support plates 10 and 14 it is necessary to braze or hard solder the leads to the support plates 10 and 14 with some suitable hard material having a melting point at least 400° C. and preferably of the order of 600° C. to 700° C. Such a hard solder may be prepared with an alloy of silver. A solder satisfactory for this bonding is disclosed in the Frola et al. Patent 2,763,822.

It has been found that with the high power device such as a rectifier diode having the ratings mentioned above that when the large current conductors 17 and 18 are attached to the support elements 10 and 14 of the diode by brazing or hard soldering that it becomes necessary to heat the diode assembly up to a temperature of at least 400° C. and preferably of the order of 600° C. to 700° C. to obtain a good bond between the current conductors and the support plates 10 and 14. As mentioned hereinbefore for a diode using germanium semiconductor material the minimum solidus for germanium-tin is 230° C. and for a diode using silicon for the semiconductor element the minimum solidus for aluminum-silicon is approximately 577° C. Consequently if the assembly shown in FIG. 1 is again heated after its original fabrication to a temperature of the order of 600° C. to 700° C. to braze or hard solder the current conductors 17 and 18 thereto in some cases the previously soldered joints of the diode shown in FIG. 1 would be remelted and the device would be destroyed. In some devices it has been found that the p-n junction was actually destroyed by reheating the device to a high temperature to attach the current conducting elements. It has also been found that because of the large area of the current conducting elements 17 and 18 that when the current conducting elements 17 and 18 are brazed or hard soldered directly to the support plates 10 and 14 respectively that appreciable stresses are locked in the support plates 10 and 14 which may tend to cause an early failure in the rectifier device.

This invention eliminates the above mentioned objections to the prior art devices especially in high rated power devices by brazing or hard soldering to the current conducting electrodes an additional element which has substantially the same thermal coefficient of expansion as the support plates 10 and 14. As shown in FIGS. 2 and 3 a metal member 20 which has approximately the same linear coefficient of expansion as the support plate 10 is brazed or hard soldered by a layer of bonding material 21 to the electrical conductor 17. The electrical conductor 17 is usually made of copper or some other good current conductor and it has a much different linear coefficient of expansion, as seen from the table listed hereinbefore than the metal member 20. Therefore the solder or brazing material must be strong enough to withstand the stresses set up between these two metals of widely different coefficients of linear expansions when the device is thermally cycled. Likewise the electrical conductor 18 is usually made of some material such as copper which is a good current conductor and which has a much different thermal coefficient of expansion than the support plate 14. A metal member 23 having approximately the same thermal coefficient of expansion as the support plate 14 is attached to the electrical conductor 18 with a layer 24 of hard solder of brazing material which is strong enough to withstand any stresses set up in the joint due to thermal cycling of the device. The members 20 and 23 may be made from molybdenum, tungsten, or tantalum or any base alloy thereof.

The next step in the assembling operation, FIG. 3, comprises soldering of the metal member 20 to the metal support plate 10 with a layer 25 of soft solder and soldering of the metal member 23 to the support plate 14 with another layer 26 of soft solder. The soft solder used for attaching the metal member 20 to the metal member 10 and the metal member 23 to the metal member 14 may be a pure tin solder or base alloys thereof which has a melting point of approximately 232° C.

It is seen that with this assembly after the semiconductor device has been assembled as illustrated in FIG. 1 and the current conductors 17 and 18 have been prepared by attaching the metal members 20 and 23 thereto that the only heating that is necessary to complete the assembly is to melt the layers 25 and 26 of soft solder by heating to a temperature of approximately 232° C. It has been found that this temperature is so low that it does not effect the previously soldered joints 12 and 13 of the device of FIG. 1 and does not set up any appreciable additional stresses in the device.

After the device has been completely assembled by soldering all of the joints, it is then enclosed in a hermetically sealed casing which comprises a lower metal member 27' and an upper metal member 27 joined by an electrical insulator 28. Electrical connections may be made to the device at 30 and 31 to connect the semi-conductor device into an electrical circuit.

It has been found from experience that the construction set forth hereinbefore provides a high yield of good devices in manufacture, a very efficient device in operation, which is relatively free from defects or faults caused by thermal cycling. This is especially true when working with devices having dimensions and ratings of the order and above those mentioned hereinbefore.

Although the semiconductor device has been described and referred to in FIGS. 1, 2 and 3 throughout as a diode rectifier device, it is to be understood that the same techniques and procedures may be followed in making any type of semiconductor device, such as a three element or controlled rectifier, or devices commonly referred to as transistors.

It will be understood that the invention is capable of various modifications and embodiments and is not limited to the specific details of construction shown in the drawings for the purpose of illustration.

I claim as my invention:

1. In a semiconductor device, in combination, a brittle wafer of semiconductor material selected from the group consisting of silicon and germanium, the wafer being of substantial area and relatively thin, metal support plates joined to opposite sides of the wafer of semiconductor material with a layer of solder which provides joints of good thermal and electrical conductivity, the coefficient of expansion of said support plates being substantially the same as the coefficient of expansion of said wafer of semiconductor material throughout the temperature range to which the semiconductor device is subjected in manufacture and use, a first terminal member having a substantially different coefficient of expansion than said semiconductor wafer, a first metal member having substantially the same coefficient of expansion as said support plates attached to said first terminal member with a layer of hard material, a layer of soft solder attaching said first metal member to one of said support plates, a second terminal member having a substantially different coefficient of expansion than said semiconductor wafer, a second metal member having substantially the same coefficient of expansion as said support plates attached to said second terminal member with a layer of hard material, and a layer of soft solder attaching said second metal member to the other of said support plate.

2. In a semiconductor device, in combination a brittle wafer of semiconductor material selected from the group consisting of silicon and germanium, the wafer being of substantial area and relatively thin, metal support plates joined to opposite sides of the wafer of semiconductor material with a layer of solder which provides joints of good thermal and electrical conductivity, the coefficient of expansion of said support plates being substantially the same as the coefficient of expansion of said wafer of semiconductor material throughout the temperature range to which the semiconductor device is subjected in manufacture and use, a first terminal member having a substantially different coefficient of expansion than said semiconductor wafer, a first molybdenum member having substantially the same coefficient of expansion as said support plates attached to said first terminal member with a layer of hard solder, a layer of soft solder attaching said first molybdenum member to one of said support plates, a second terminal member having a substantially different coefficient of expansion than said semiconductor wafer, a second molybdenum member having substantially the same coefficient of expansion as said support plate attached to said second terminal member with a layer of hard solder, and a layer of soft solder attaching said second molybdenum member to the other of said support plates.

3. In a semiconductor device, in combination, a wafer of semiconductor material selected from the group consisting of silicon and germanium, the wafer of semiconductor material being of substantial area and relatively thin, metal support plates joined to opposite sides of the wafer of semiconductor material with a layer of solder which provides joints of good thermal and electrical conductivity, the coefficient of expansion of said support plates being substantially the same as the coefficient of expansion of said wafer of semiconductor material throughout the temperature range to which the semiconductor device is subjected in manufacture and use, a first terminal member having a substantially different coefficient of expansion than said semiconductor wafer, a first tungsten metal member having substantially the same coefficient of expansion as said support plate attached to said first terminal member with a layer of hard solder, a layer of soft solder attaching said first tungsten metal member to one of said support plates, a second terminal member having a substantially different coefficient of expansion than said semiconductor wafer, a second tungsten metal member having substantially the same coefficient of expansion as said support plate attached to said second terminal member with a layer of hard solder, and a layer of soft solder attaching said second tungsten metal member to the other of said support plates.

4. In a semiconductor device, in combination, a wafer of semiconductor material selected from the group consisting of silicon and germanium, the wafer of semiconductor material being of substantial area and relatively thin, metal support plates joined to opposite sides of the wafer of semiconductor material with a layer of solder which provides joints of good thermal and electrical conductivity, the coefficient of expansion of said support plates being substantially the same as the coefficient of expansion of said wafer of semiconductor material throughout the temperature range to which the semiconductor device is subjected in manufacture and use, a first terminal member having a substantially different coefficient of expansion than said semiconductor wafer, a first tantalum metal member having substantially the same coefficient of expansion as said support plates attached to said first terminal member with a layer of hard solder, a layer of soft solder attaching said first tantalum metal member to one of said support plates, a second terminal member having substantially different coefficient of expansion than said semiconductor wafer, a second tantalum metal member having substantially the same coefficient of expansion as said support plates attached to said terminal member with a layer of hard solder, and a layer of soft solder attaching said second tantalum metal member to the other of said support plates.

5. In a semiconductor device, in combination, a wafer of semiconductor material selected from the group consisting of germanium and silicon, the wafer of semiconductor material being of substantial area and relatively thin, metal support plates joined to opposite sides of the wafer of semiconductor material with a layer of solder which provides joints of good thermal and electrical conductivity, the coefficient of expansion of said support plates being substantially the same as the coefficient of expansion of said wafer of semiconductor material throughout the temperature range to which the semiconductor device is subjected in manufacture and use, a first terminal member having a substantially different coefficient of expansion than said semiconductor wafer, a first metal member having substantially the same coefficient of expansion as said support plates attached to said first terminal member with a layer of silver solder, a layer of tin solder attaching said first metal member to one of said support plates, a second terminal member having a substantially different coefficient of expansion than said semiconductor wafer, a second metal member having substantially the same coefficient of expansion as said support plates attached to said second terminal member with a layer of silver solder, and a layer of tin solder attaching said second metal member to the other of said support plates.

6. In a semiconductor device, in combination, a wafer of semiconductor material selected from the group consisting of silicon and germanium, the wafer of semiconductor material being of substantial area and relatively thin, metal support plates joined to opposite sides of the wafer of semiconductor materials with a layer of solder which provides joints of good thermal and electrical conductivity, the coefficient of expansion of said support plates being substantially the same as the coefficient of expansion of said wafer of semiconductor material throughout the temperature range to which the semiconductor device is subjected in manufacture and use, a first terminal member having a substantially different coefficient of expansion than said semiconductor wafer, a first metal member having substantially the same coefficient of expansion as said support plate attached to said first terminal member with a layer of hard solder, a layer of soft solder attaching said first metal member to one of said support plates, and a second terminal member having substantially different coefficient of expansion than said semiconductor wafer, and means attaching said second terminal member to the other of said support plates, with a joint of good thermal and electrical conductivity.

References Cited in the file of this patent

UNITED STATES PATENTS

| | | |
|---|---|---|
| 2,849,665 | Boyer et al. | Aug. 26, 1958 |
| 2,921,245 | Wallace et al. | Jan. 12, 1960 |
| 2,922,092 | Gazzara et al. | Jan. 19, 1960 |
| 2,933,662 | Boyer et al. | Apr. 19, 1960 |
| 2,946,935 | Finn | July 26, 1960 |